United States Patent
Shinohara

(10) Patent No.: US 10,573,743 B2
(45) Date of Patent: Feb. 25, 2020

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Daisuke Shinohara, Yokohama Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/128,757

(22) Filed: Sep. 12, 2018

(65) Prior Publication Data

US 2019/0288108 A1 Sep. 19, 2019

(30) Foreign Application Priority Data

Mar. 16, 2018 (JP) .................... 2018-050085

(51) Int. Cl.
*H01L 29/78* (2006.01)
*H01L 29/423* (2006.01)
*H01L 29/40* (2006.01)

(52) U.S. Cl.
CPC ........ *H01L 29/7816* (2013.01); *H01L 29/402* (2013.01); *H01L 29/42368* (2013.01); *H01L 29/7835* (2013.01)

(58) Field of Classification Search
CPC ............... H01L 29/7816; H01L 29/402; H01L 29/42368
See application file for complete search history.

(56) References Cited

U.S. PATENT DOCUMENTS

| | | | |
|---|---|---|---|
| 6,740,952 B2 | 5/2004 | Fujishima et al. | |
| 8,692,325 B2 | 4/2014 | Yanagi | |
| 9,362,398 B2 | 6/2016 | Pendharkar | |
| 9,450,056 B2 | 9/2016 | Ng et al. | |
| 2008/0067624 A1* | 3/2008 | Chen | H01L 23/585 257/492 |
| 2008/0246086 A1* | 10/2008 | Korec | H01L 29/41741 257/343 |

(Continued)

FOREIGN PATENT DOCUMENTS

| | | |
|---|---|---|
| JP | H10-12876 A | 1/1998 |
| JP | 2002-270830 A | 9/2002 |

(Continued)

*Primary Examiner* — Sitaramarao S Yechuri
(74) *Attorney, Agent, or Firm* — White & Case LLP

(57) ABSTRACT

A semiconductor device includes a first semiconductor region, a second semiconductor region, an insulating film, and first and second electrodes provided on the insulating film. The insulating film includes first to fourth portions. The first portion is disposed in a region including the region directly above the first semiconductor region. The second portion is disposed at a portion of the region directly above the second semiconductor region. The second portion is thicker than the first portion. The third portion is thinner than the second portion and thicker than the first portion. The fourth portion is thicker than the third portion. The first electrode is disposed in at least a region directly above the first portion. The second electrode is disposed in at least a region directly above the third portion.

11 Claims, 8 Drawing Sheets

(56) References Cited

U.S. PATENT DOCUMENTS

| | | | |
|---|---|---|---|
| 2009/0289312 A1* | 11/2009 | Mori | H01L 27/088 257/409 |
| 2012/0187485 A1 | 7/2012 | Morioka | |
| 2013/0020632 A1* | 1/2013 | Disney | H01L 29/402 257/328 |
| 2013/0127521 A1* | 5/2013 | Simin | G05F 3/02 327/530 |
| 2014/0035032 A1* | 2/2014 | Korec | H01L 21/8234 257/337 |
| 2015/0041963 A1* | 2/2015 | Schulze | H01L 21/225 257/632 |
| 2015/0108503 A1* | 4/2015 | Kudou | H01L 29/0611 257/77 |
| 2016/0111505 A1* | 4/2016 | Simin | H01L 29/405 257/192 |
| 2016/0225863 A1* | 8/2016 | Simin | H01L 29/404 |
| 2017/0170284 A1* | 6/2017 | Li | H01L 29/401 |

FOREIGN PATENT DOCUMENTS

| | | | |
|---|---|---|---|
| JP | 5504187 B2 | 5/2014 | |
| JP | 5769915 B2 | 8/2015 | |

* cited by examiner

SEMICONDUCTOR DEVICE

CROSS-REFERENCE TO RELATED APPLICATIONS

This application is based upon and claims the benefit of priority from Japanese Patent Application No. 2018-050085, filed on Mar. 16, 2018; the entire contents of which are incorporated herein by reference.

FIELD

Embodiments relate to a semiconductor device.

BACKGROUND

Conventionally, it is desirable to realize both a low on-resistance and a high breakdown voltage in a MOSFET (Metal-Oxide-Semiconductor Field-Effect Transistor).

DETAILED DESCRIPTION

A semiconductor device according to one embodiment, includes a semiconductor portion, a first semiconductor region provided on the semiconductor portion, a second semiconductor region provided on the semiconductor portion, a source contact connected to the first semiconductor region, a drain contact connected to the second semiconductor region, an insulating film, a first electrode provided on the insulating film, and a second electrode provided on the insulating film. The first semiconductor region is of a first conductivity type. The second semiconductor region is of a second conductivity type. The insulating film is provided from a region directly above the first semiconductor region to a region directly above the second semiconductor region. The insulating film is disposed between the source contact and the drain contact. The first electrode is disposed in a region including the region directly above the first semiconductor region. The second electrode is disposed at a portion of the region directly above the second semiconductor region, and separated from the first electrode. The insulating film includes a first portion, a second portion, a third portion, and a fourth portion. The first portion is disposed in a region including the region directly above the first semiconductor region. The second portion is disposed at a portion of the region directly above the second semiconductor region. The second portion is thicker than the first portion. The third portion is thinner than the second portion and thicker than the first portion. The fourth portion is thicker than the third portion. At least a part of the fourth portion is disposed between the second electrode and the drain contact. The first portion, the second portion, the third portion, and the fourth portion are arranged in this order along a first direction. The first direction is from the first semiconductor region toward the second semiconductor region. The first electrode is disposed in at least a region directly above the first portion. The second electrode is disposed in at least a region directly above the third portion.

First Embodiment

First, a first embodiment will be described.

Figure 1:
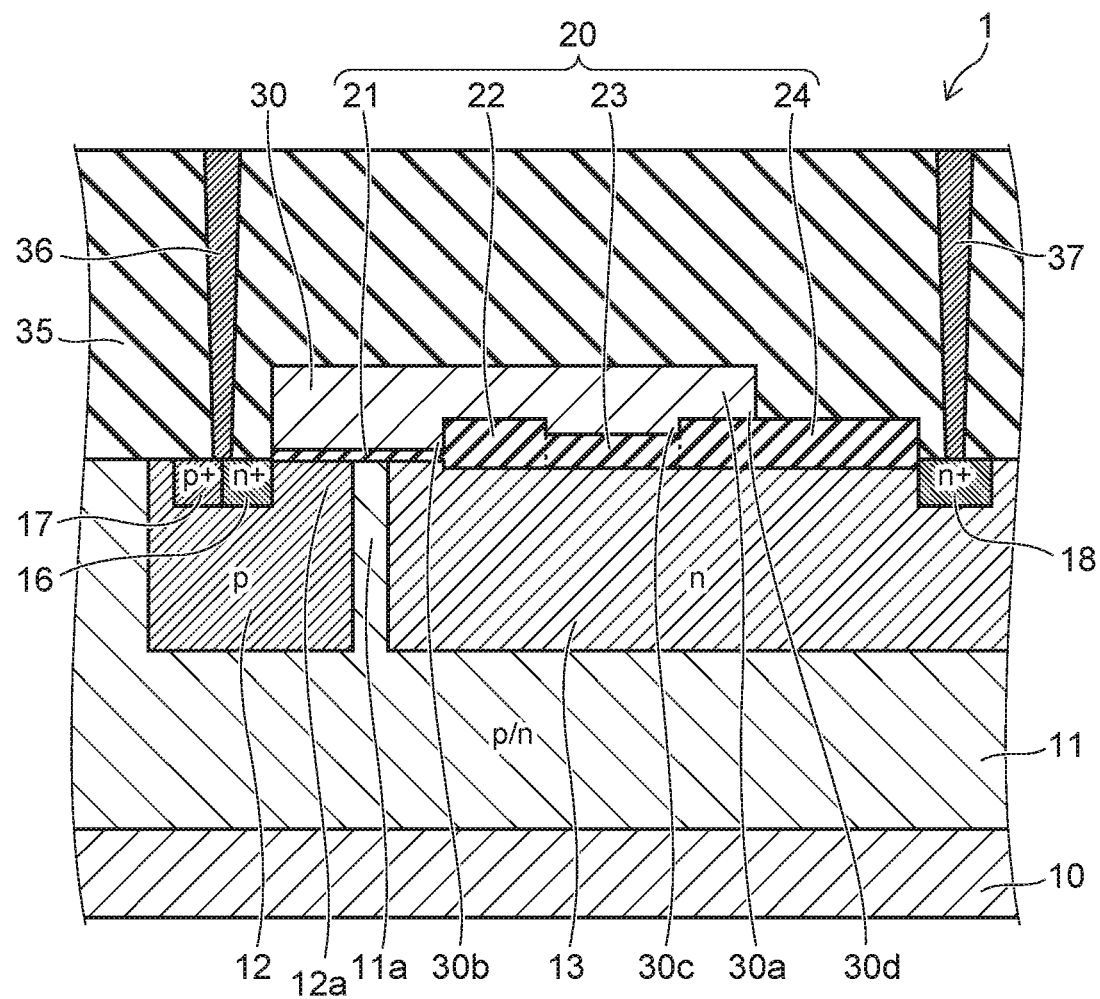
FIG. 1 is a cross-sectional view showing a semiconductor device according to a first embodiment.

FIG. 1 is a cross-sectional view showing a semiconductor device according to the embodiment.

The semiconductor device according to the embodiment includes a MOSFET, e.g., a DMOS (Diffused MOSFET), and in particular, a FP (Field Plate) structure-type DMOS. The semiconductor device according to the embodiment may include a LDMOS (Lateral DMOS), a DEMOS (Drain Extended MOS), or an EDMOS (Extended Drain MOS).

In the semiconductor device 1 according to the embodiment as shown in FIG. 1, for example, a silicon substrate 10 that is made of a single crystal of silicon (Si) is provided; and a silicon layer 11 is provided on the silicon substrate 10. The conductivity type of the silicon layer 11 is a p-type or an n-type. A p-well 12 of the p-type and a drift layer 13 of the n-type are provided on the silicon layer 11. The p-well 12 and the drift layer 13 may be separated from each other. In such a case, a portion 11a of the silicon layer 11 is interposed between the p-well 12 and the drift layer 13. The p-well 12 and the drift layer 13 may contact each other. An example is shown in FIG. 1 in which the p-well 12 and the drift layer 13 are separated from each other.

A source contact layer 16 of the n+-type and a body contact layer 17 of the p+-type are formed in a portion of the upper layer portion of the p-well 12. The notation of the "n+-type" indicates that the concentration of the impurity that forms donors is higher than that of the "n-type." The notation of the "p+-type" indicates that the concentration of the impurity that forms acceptors is higher than that of the "p-type." The source contact layer 16 and the body contact layer 17 contact each other and are separated from the silicon layer 11, The body contact layer 17 may not be provided.

A drain contact layer 18 of the n+-type is formed in a portion of the upper layer portion of the drift layer 13. The drain contact layer 18 is separated from the silicon layer 11. The distance between the drain contact layer 18 and the p-well 12 is longer than the distance between the source contact layer 16 and the drift layer 13. The conductivity types of the portions described above may be reversed.

Although the silicon layer 11 may be formed by, for example, epitaxial growth using the upper surface of the silicon substrate 10 as a starting point, this is not limited thereto. The p-well 12, the drift layer 13, the source contact layer 16, the body contact layer 17, and the drain contact layer 18 are formed by ion implantation of an impurity into the silicon layer 11.

In the case where the silicon layer 11 is of the p-type, the portion 11a of the silicon layer 11 and a portion 12a of the p-well 12 disposed between the portion 11a and the source contact layer 16 are included in a channel region. On the other hand, in the case where the silicon layer 11 is of the n-type, the portion 12a of the p-well 12 is included in the channel region.

An insulating film 20 that is made of, for example, silicon oxide (SiO) is provided on the silicon layer 11. The insulating film 20 is disposed in a region directly above the portion 12a of the p-well 12, a region directly above the portion 11a of the silicon layer 11, and a region directly above the drift layer 13. A portion 21, a portion 22, a portion 23, and a portion 24 are provided as one body in the insulating film 20 and are arranged in this order along a direction from the source contact layer 16 toward the drain contact layer 18.

The portion 21 is disposed in the region directly above the portion 12a, the region directly above the portion 11a, and a region directly above a portion of the drift layer 13 on the portion 11a side. The portions 22, 23, and 24 are disposed at portions of the region directly above the drift layer 13. The portion 22 and the portion 24 have substantially the same thickness and are thicker than the portion 21. The portion 23 is thinner than the portion 22 and the portion 24 and thicker than the portion 21. In other words, $t_{21} < t_{23} < t_{22} \approx t_{24}$, wherein the thicknesses of the portions 21 to 24 respectively are $t_{21}$ to $t_{24}$.

Although the lower surface of the insulating film 20 is substantially flat, strictly speaking, the lower surface of the portion 21 is positioned slightly higher than the lower surfaces of the portions 22, 23, and 24. On the other hand, the lower surfaces of the portions 22, 23, and 24 are in substantially the same plane. The lower portions of the portions 22, 23, and 24 slightly enter the silicon layer 11. However, this is not limited thereto; and the lower surface of the portion 21 also may be in substantially the same plane as the lower surfaces of the portions 22, 23, and 24, Also, the positions of the lower surfaces of the portions 21 to 24 may be different from each other.

A gate electrode 30 is provided on the insulating film 20. The gate electrode 30 is made from a conductive material and is formed of, for example, polysilicon or a metal. The gate electrode 30 is disposed in a region directly above the entire portion 21, the entire portion 22, the entire portion 23, and a portion of the portion 24 on the portion 23 side of the insulating film 20. In other words, an end portion 30a of the gate electrode 30 on the drain contact layer 18 side extends onto the portion 24 of the insulating film 20.

An inter-layer insulating film 35 that is made of, for example, silicon oxide is provided on the silicon layer 11. The inter-layer insulating film 35 covers the insulating film 20 and the gate electrode 30, A source contact 36 and a drain contact 37 are provided inside the inter-layer insulating film 35. The lower end of the source contact 36 is connected to the source contact layer 16 and the body contact layer 17. The lower end of the drain contact 37 is connected to the drain contact layer 18. A portion of the insulating film 20 is disposed between the source contact 36 and the drain contact 37.

Operations of the semiconductor device 1 according to the embodiment will now be described.

In the semiconductor device 1, a drain potential, e.g., +50 V is applied to the drain contact 37; and a source potential, e.g., a ground potential (0 V) is applied to the source contact 36. The drain potential is conducted to the drift layer 13 via the drain contact layer 18. The source potential is conducted to the source contact layer 16. Thereby, a depletion layer is formed using the interface between the p-well 12 and the source contact layer 16 as a starting point.

At this time, when the potential of the gate electrode 30 is the source potential, a current does not flow between the drain contact 37 and the source contact 36; and the semiconductor device 1 is set to the off-state. In such a case, a gate-drain voltage is applied between the gate electrode 30 and the drift layer 13. On the other hand, when a prescribed positive potential is applied to the gate electrode 30, an inversion layer is formed at the vicinity of the insulating film 20 in the channel region; and a current flows in the path of the drain contact 37, the drain contact layer 18, the drift layer 13, the portion 11a of the silicon layer 11, the portion 12a of the p-well 12, the source contact layer 16, and the source contact 36. Thereby, the semiconductor device 1 is set to the on-state.

Effects of the embodiment will now be described.

In the semiconductor device 1 according to the embodiment, the potential of the channel region is nearer to the potential of the source contact layer 16 than to the potential of the drain contact layer 18 because the distance between the drain contact layer 18 and the channel region is longer than the distance between the source contact layer 16 and the channel region. Thereby, in the off-state, the voltage that is applied to the portion 21 of the insulating film 20 by the gate electrode 30 and the drift layer 13 can be reduced. As a result, the breakdown voltage between the gate-drain can be increased.

In the semiconductor device 1, the lower surface of the insulating film 20 is substantially flat and substantially does not enter the silicon layer 11; therefore, the obstruction by the insulating film 20 of the SD current flowing through the drift layer 13 in the on-state is low. Thereby, the on-resistance can be reduced.

In the semiconductor device 1, the gate electrode 30 extends over the channel region to the drift layer 13; therefore, the concentration of the electric field applied to the drift layer 13 can be relaxed. Thereby, the breakdown voltage increases. Also, in such a case, the gate-drain voltage is the highest between the drift layer 13 and the end portion 30a of the gate electrode 30 on the drain contact layer 18 side. However, the end portion 30a of the gate electrode 30 extends onto the portion 24 of the insulating film 20; and the thick portion 24 is interposed between the end portion 30a and the drift layer 13. Therefore, the breakdown voltage of this portion can be increased; and the breakdown voltage of the entire semiconductor device 1 can be increased.

In the semiconductor device 1, the portion 23 that is thinner than the portions 22 and 24 of the insulating film 20 is provided between the portion 22 and the portion 24. Thereby, three corners 30b, 30c, and 30d that protrude toward the drain side are formed in the lower surface of the gate electrode 30. In the off-state, because the electric field concentrates in the three corners 30b, 30c, and 30d, the concentration of the electric field is dispersed; and the concentration in only one location can be avoided. Thereby, the breakdown voltage of the entire semiconductor device 1 increases. Also, because the gate electrode 30 is provided also on the portion 23 that is thinner than the portions 22 and 24, the controllability of the drift layer 13 by the gate electrode 30 increases; and the field plate effect of the gate electrode 30 improves.

Second Embodiment

A second embodiment will now be described.

Figure 2:
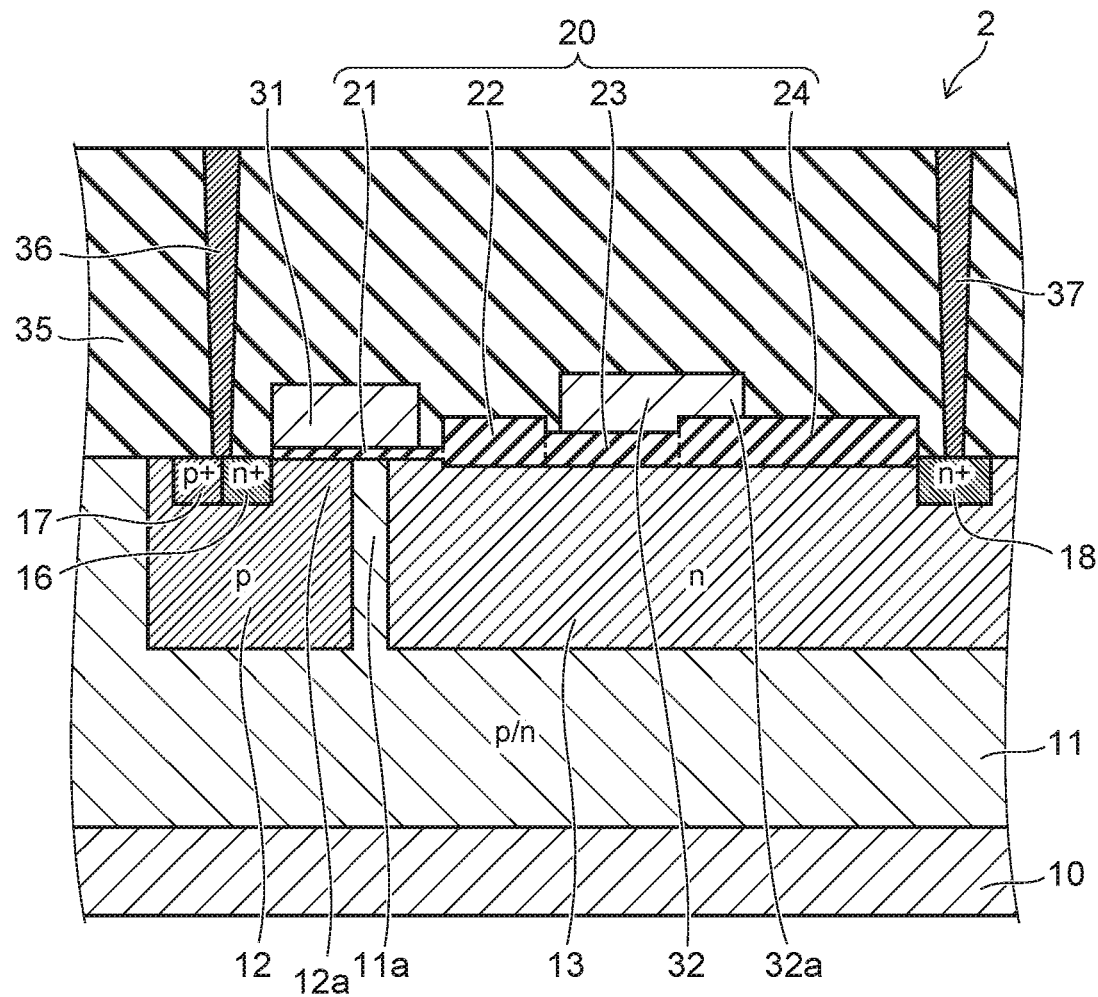
FIG. 2 is a cross-sectional view showing a semiconductor device according to a second embodiment.

FIG. 2 is a cross-sectional view showing a semiconductor device according to the embodiment.

As shown in FIG. 2, the semiconductor device 2 according to the embodiment differs from the semiconductor device 1 according to the first embodiment described above (referring to FIG. 1) in that two gate electrodes are provided. Namely, in the semiconductor device 2, a gate electrode 31 and a gate electrode 32 are provided to be separated from each other on the insulating film 20. The gate electrode 31 is disposed on the source contact layer 16 side from the gate electrode 32; and the gate electrode 32 is disposed on the drain contact layer 18 side from the gate electrode 31. Mutually-different potentials or the same potential may be applied to the gate electrode 31 and the gate electrode 32.

The gate electrode 31 is disposed in only a region directly above the portion 21 of the insulating film 20, and is disposed in a region including a region directly above the channel region. The gate electrode 32 is disposed in a region directly above a portion of the portion 23 of the insulating film 20 on the portion 24 side and in a region directly above a portion of the portion 24 on the portion 23 side. In other words, an end portion 32a of the gate electrode 32 on the drain contact layer 18 side extends onto the portion 24.

According to the embodiment, the degrees of freedom of the operations of the semiconductor device 2 are increased by providing the two gate electrodes 31 and 32 and by applying potentials independently from each other.

The breakdown voltage between the gate electrode 32 and the drift layer 13 can be increased because the end portion 32a of the gate electrode 32 on the drain side extends onto the portion 24 that is thicker than the portion 23. Further, corners that protrude toward the drain side are formed at the lower surface of the gate electrode 32 at two locations; therefore, the concentration of the electric field can be dispersed; and the breakdown voltage of the entirety can be increased.

Otherwise, the configuration, the operations, and the effects of the embodiment are similar to those of the first embodiment described above.

Third Embodiment

A third embodiment will now be described.

Figure 3:
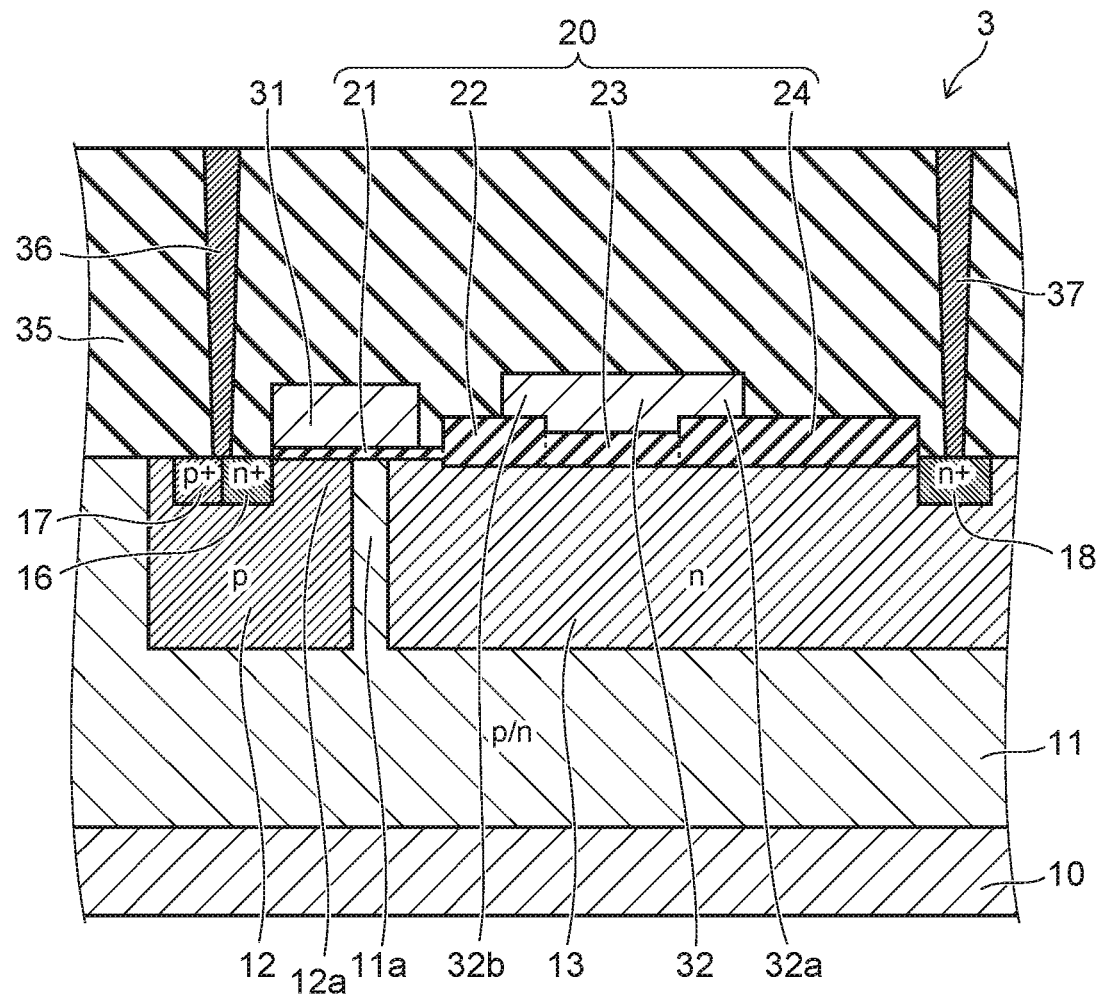
FIG. 3 is a cross-sectional view showing a semiconductor device according to a third embodiment.

FIG. 3 is a cross-sectional view showing a semiconductor device according to the embodiment.

As shown in FIG. 3, the semiconductor device 3 according to the embodiment differs from the semiconductor device 2 according to the second embodiment described above (referring to FIG. 2) in that an end portion 32b of the gate electrode 32 on the source contact layer 16 side extends onto the portion 22 of the insulating film 20. Namely, the gate electrode 32 is disposed in a region directly above the portion 23, a portion of the portion 24, and an end portion of the portion 22 of the insulating film 20 on the portion 23 side.

Otherwise, the configuration, the operations, and the effects of the embodiment are similar to those of the second embodiment described above.

Fourth Embodiment

A fourth embodiment will now be described.

Figure 4:
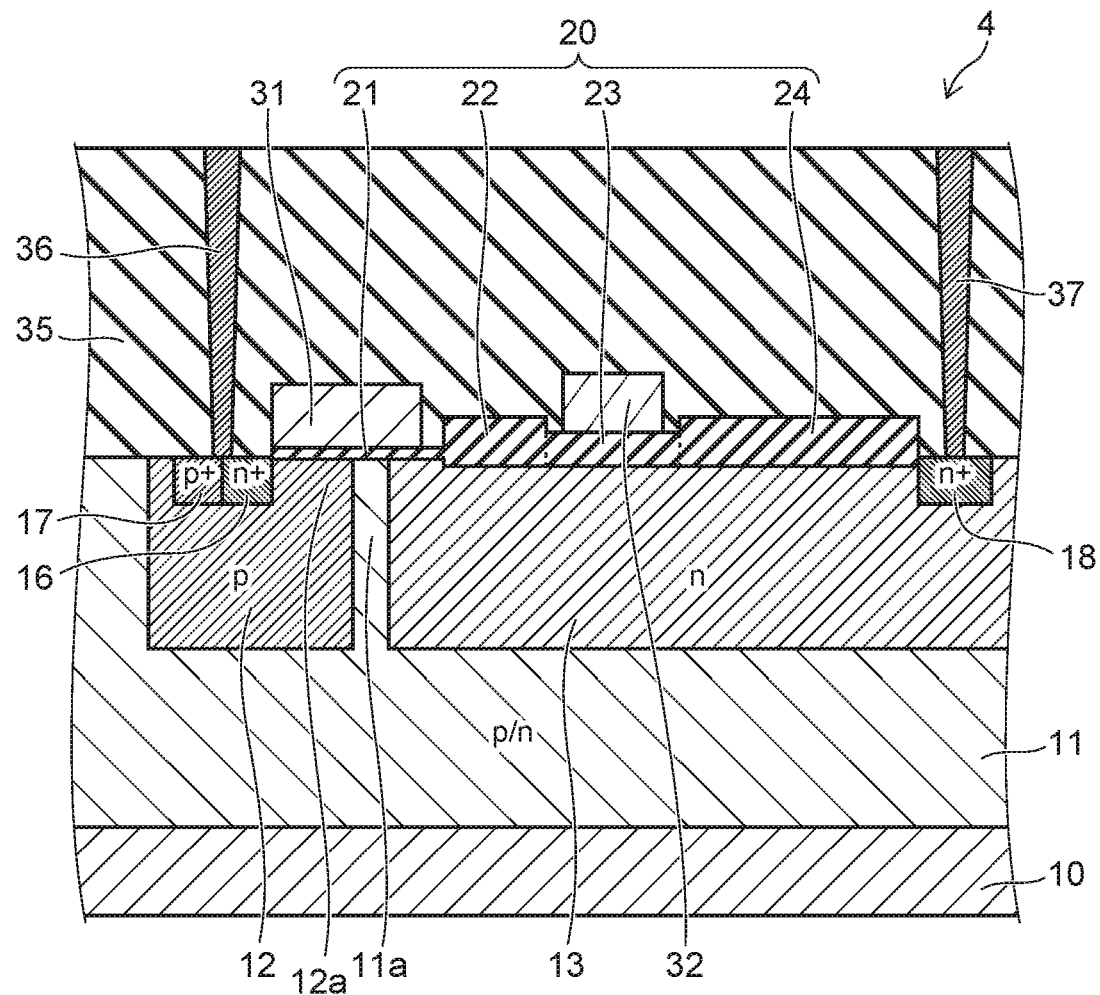
FIG. 4 is a cross-sectional view showing a semiconductor device according to a fourth embodiment.

FIG. 4 is a cross-sectional view showing a semiconductor device according to the embodiment.

As shown in FIG. 4, the semiconductor device 4 according to the embodiment differs from the semiconductor device 2 according to the second embodiment described above (referring to FIG. 2) in that the gate electrode 32 is disposed only on the portion 23 of the insulating film 20. In other words, end portions of the gate electrode 32 do not extend onto the portion 24 and the portion 22.

Otherwise, the configuration, the operations, and the effects of the embodiment are similar to those of the second embodiment described above.

Fifth Embodiment

A fifth embodiment will now be described.

Figure 5:
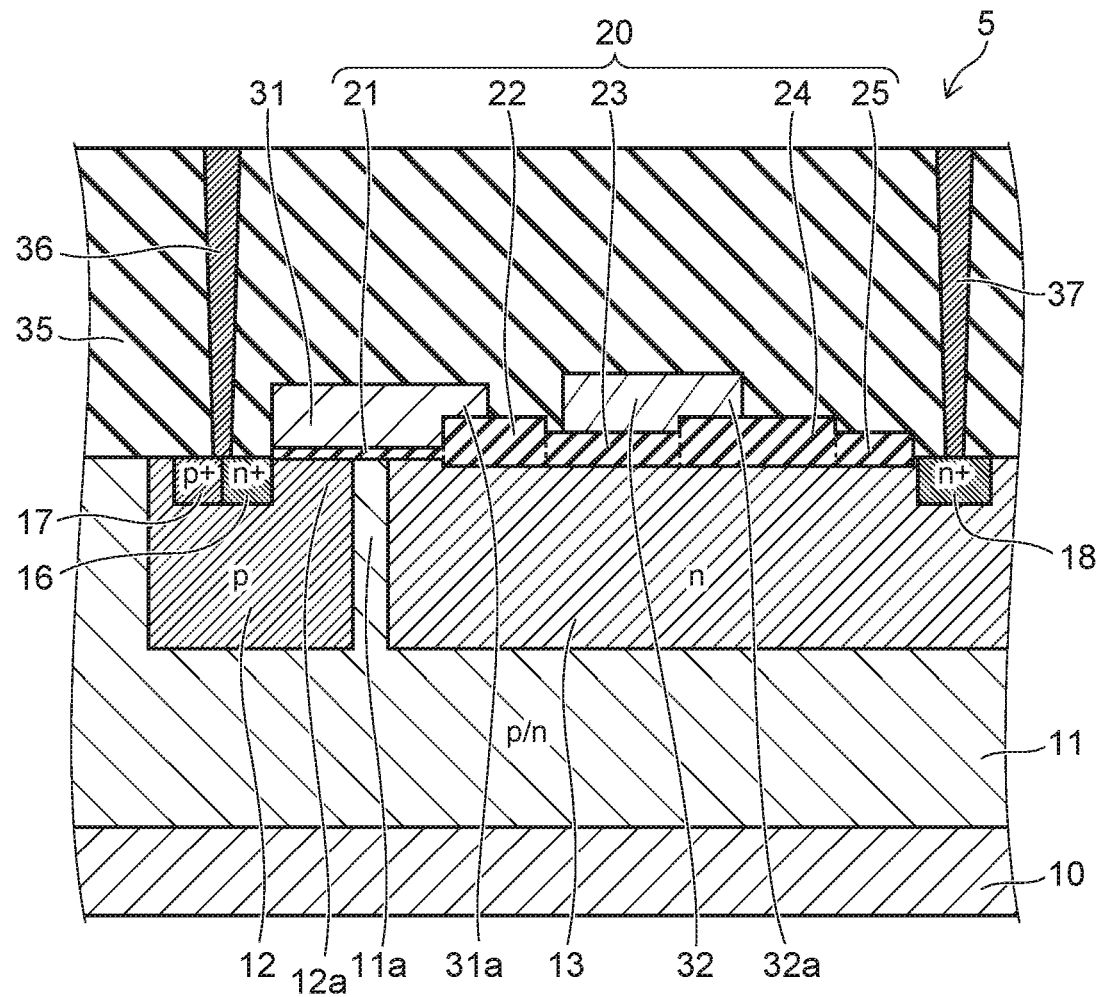
FIG. 5 is a cross-sectional view showing a semiconductor device according to a fifth embodiment.

FIG. 5 is a cross-sectional view showing a semiconductor device according to the embodiment.

As shown in FIG. 5, the semiconductor device 5 according to the embodiment differs from the semiconductor device 2 according to the second embodiment described above (referring to FIG. 2) in that a portion 25 is provided in the insulating film 20; and an end portion 31a of the gate electrode 31 on the drain contact layer 18 side extends onto the portion 22 of the insulating film 20. In other words, the gate electrode 31 is disposed in a region directly above the portion 21 of the insulating film 20 and a region directly above a portion of the portion 22 on the portion 21 side.

The portion 25 is disposed at a position of the insulating film 20 furthest on the drain side. In other words, the portion 21, the portion 22, the portion 23, the portion 24, and the portion 25 are arranged in this order in the insulating film 20 along the direction from the source contact layer 16 toward the drain contact layer 18. The portions 21 to 25 are formed of, for example, silicon oxide. The thickness of the portion 25 is about the same as that of the portion 23, is thicker than the portion 21, and is thinner than the portion 22 and the portion 24. In other words, $t_{21} < t_{23} \approx t_{25} < t_{22} \approx t_{24}$, wherein $t_{25}$ is the thickness of the portion 25. The lower surface of the portion 25 is in substantially the same plane as the lower surfaces of the portions 22 to 24 and is positioned slightly lower than the lower surface of the portion 21.

According to the embodiment, the breakdown voltage between the gate electrode 31 and the drift layer 13 can be increased because the end portion 31a of the gate electrode 31 on the drain side extends onto the portion 22 that is thicker than the portion 21. Corners that protrude toward the drain side are formed in the lower surface of the gate electrode 31 at two locations; therefore, the concentration of the electric field can be dispersed; and the breakdown voltage of the entirety can be increased.

Otherwise, the configuration, the operations, and the effects of the embodiment are similar to those of the second embodiment described above.

Sixth Embodiment

A sixth embodiment will now be described.

Figure 6:
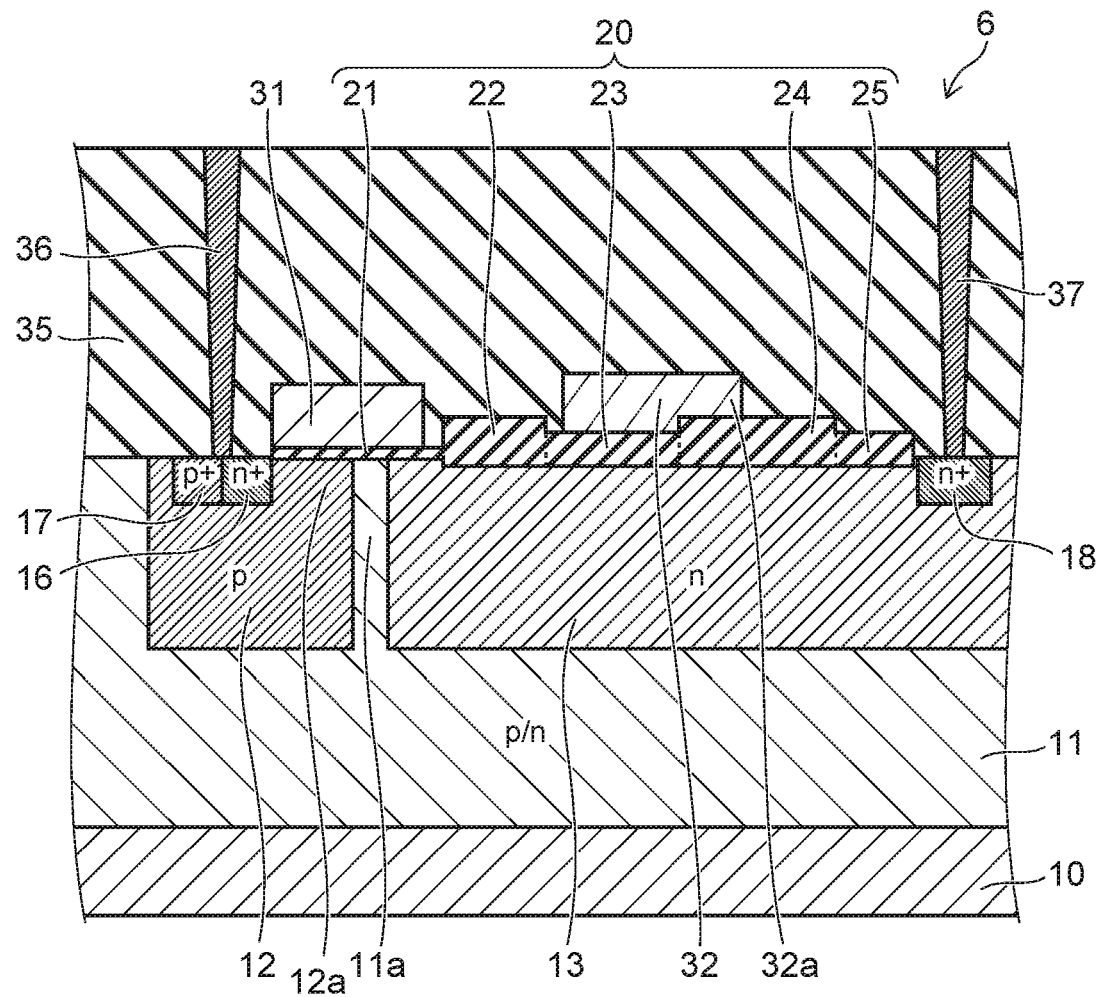
FIG. 6 is a cross-sectional view showing a semiconductor device according to a sixth embodiment.

FIG. 6 is a cross-sectional view showing a semiconductor device according to the embodiment.

As shown in FIG. 6, the semiconductor device 6 according to the embodiment differs from the semiconductor device 2 according to the second embodiment described above (referring to FIG. 2) in that the portion 25 is provided in the insulating film 20.

Otherwise, the configuration, the operations, and the effects of the embodiment are similar to those of the second embodiment described above.

First Comparative Example

A first comparative example will now be described.

Figure 7:
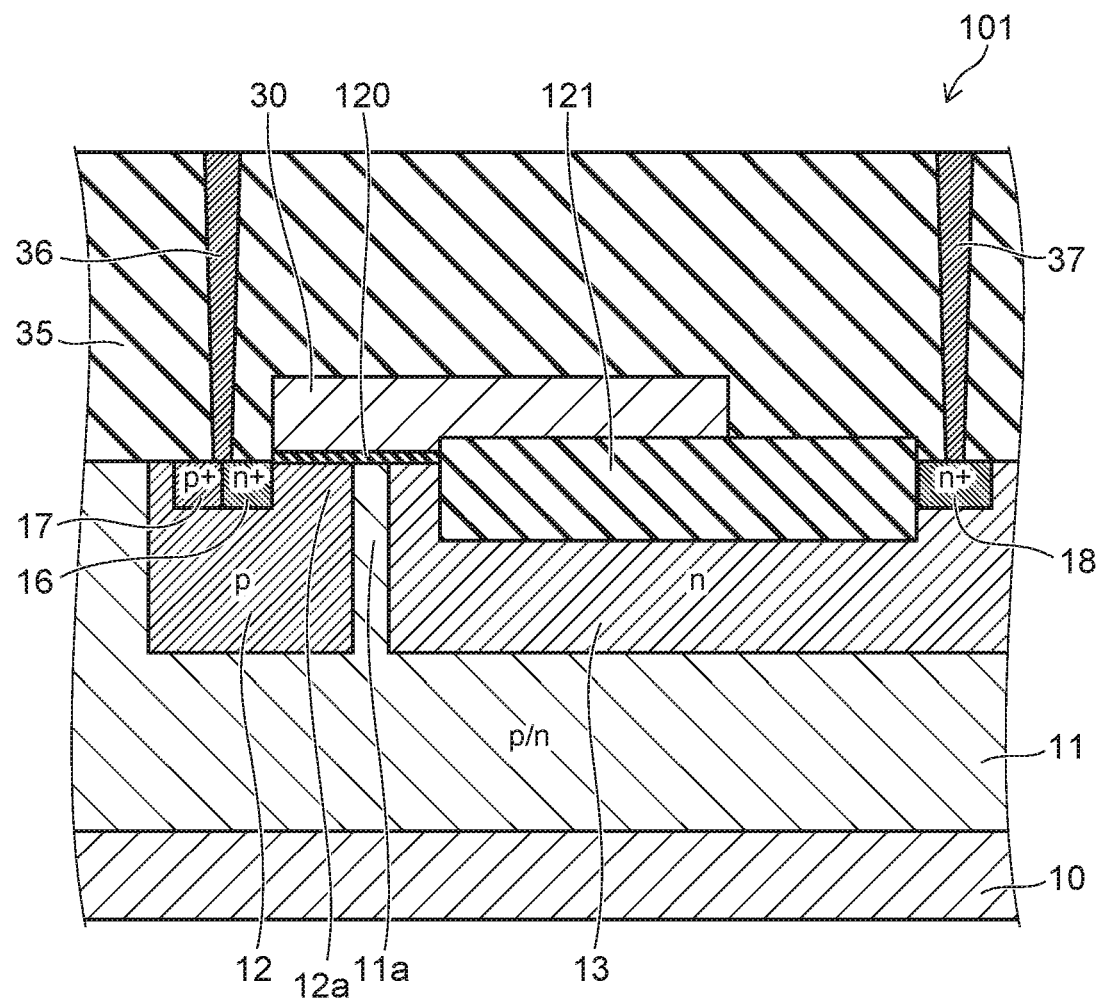
FIG. 7 is a cross-sectional view showing a semiconductor device according to a first comparative example.

FIG. 7 is a cross-sectional view showing a semiconductor device according to the first comparative example.

In the semiconductor device 101 according to the first comparative example as shown in FIG. 7, STI (Shallow Trench Isolation) 121 is provided between a gate insulating film 120 and the drain contact layer 18. The STI 121 is thicker than the gate insulating film 120; and the greater part of the STI 121 is disposed inside the drift layer 13.

Thereby, the distance between the drift layer 13 and the end portion of the gate electrode 30 on the drain side can be lengthened; and an increase of the breakdown voltage can be realized. However, in the semiconductor device 101, the SD current that flows from the drain contact layer 18 to the source contact layer 16 passes below the STI 121 to detour around the STI 121. Therefore, a resistance component in the vertical direction occurs in the SD current; and the on-resistance becomes high.

Second Comparative Example

A second comparative example will now be described.

Figure 8:
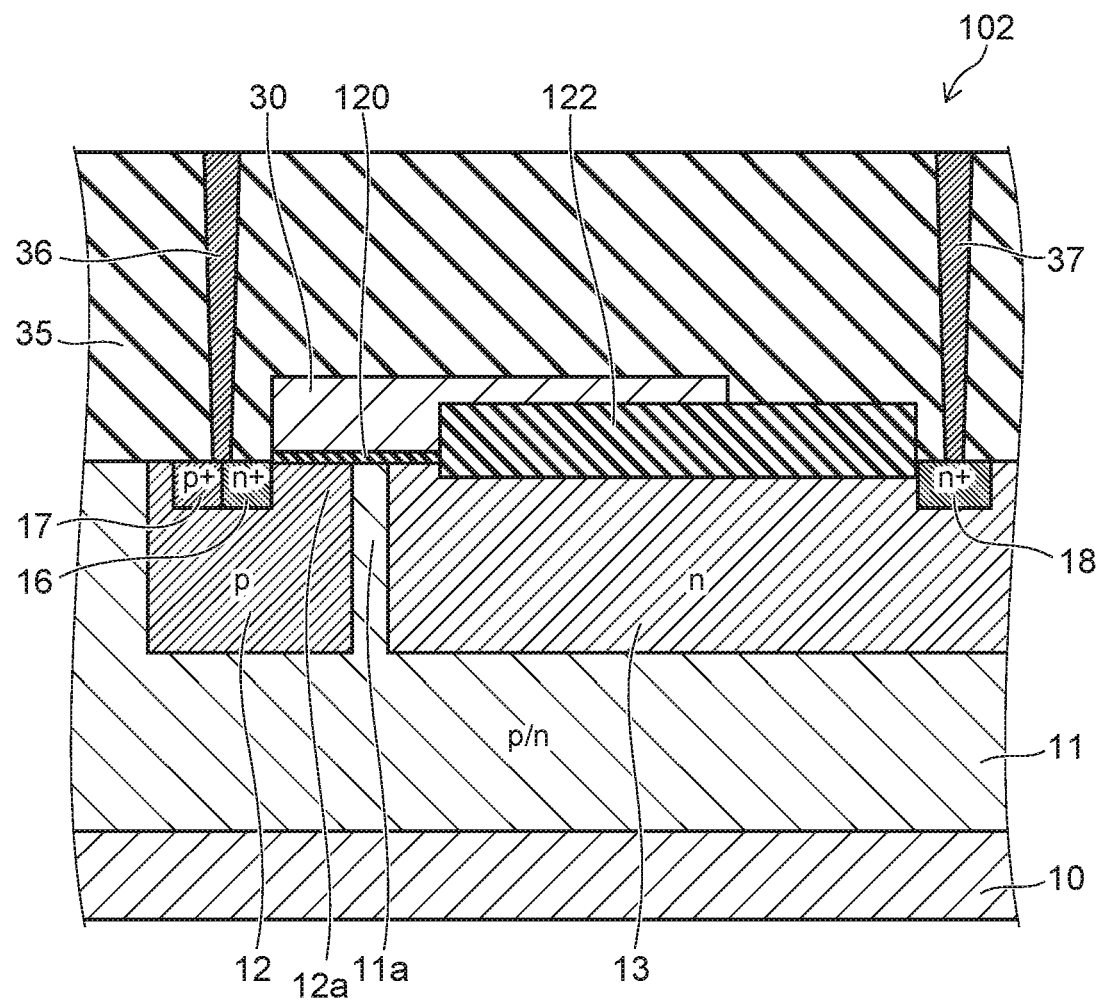
FIG. 8 is a cross-sectional view showing a semiconductor device according to a second comparative example.

FIG. 8 is a cross-sectional view showing a semiconductor device according to the second comparative example.

In the semiconductor device 102 according to the second comparative example as shown in FIG. 8, an insulating film 122 is provided on the drift layer 13. The insulating film 122 is thicker than the gate insulating film 120; and the greater part of the insulating film 122 is disposed higher than the upper surface of the silicon layer 11. A portion of the gate electrode 30 on the drain side extends onto the insulating film 122.

According to the semiconductor device 102, the obstruction of the SD current is low because the insulating film 122 substantially does not enter the drift layer 13. Therefore, a decrease of the on-resistance can be expected. Also, a portion of the gate electrode 30 is disposed on the insulating film 122; thereby, this portion functions as a field plate; and the concentration of the electric field generated between the gate electrode 30 and the drift layer 13 is relaxed. As a result, an increase of the breakdown voltage can be expected. However, it is problematic in that the effect of the field plate decreases as the thickness of the insulating film 122 is increased; and the breakdown voltage of the insulating film 122 itself decreases as the thickness of the insulating film 122 is reduced.

Test Examples

Test examples will now be described in which the characteristics of the semiconductor device according to the sixth embodiment and the semiconductor devices according to the comparative examples described above are compared.

Simulations were performed and a value B (V) of the breakdown voltage between the gate-drain and a value R (mΩmm$^2$) of the on-resistance were calculated for the semiconductor device 6 according to the sixth embodiment (referring to FIG. 6), the semiconductor device 101 according to the first comparative example (referring to FIG. 7), and the semiconductor device 102 according to the second comparative example (referring to FIG. 8). A performance indicator FOM was calculated based on Formula 1 recited below. A low performance indicator FOM is favorable; and the theoretical value is 0.85. The results are shown in Table 1.

$$FOM = \frac{1000 \times R}{B^{2.5}}$$ [Formula 1]

TABLE 1

| Sample | Breakdown voltage B (V) | On-resistance R (mΩmm$^2$) | FOM |
| --- | --- | --- | --- |
| Sixth embodiment | 54.8 | 20.2 | 0.91 |
| First comparative example | 49.7 | 26.7 | 1.54 |
| Second comparative example | 52.5 | 19.9 | 0.99 |

As shown in Table 1, compared to the first and second comparative examples, both a high breakdown voltage and a low on-resistance can be realized in the semiconductor device 6 according to the sixth embodiment.

According to the embodiments described above, a semiconductor device can be realized in which both a low on-resistance and a high breakdown voltage can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:
   a semiconductor portion;
   a first semiconductor region provided on the semiconductor portion, the first semiconductor region being of a first conductivity type;
   a second semiconductor region provided on the semiconductor portion, the second semiconductor region being of a second conductivity type;
   a source contact connected to the first semiconductor region;
   a drain contact connected to the second semiconductor region;
   an insulating film provided from a region directly above the first semiconductor region to a region directly above the second semiconductor region, the insulating film being disposed between the source contact and the drain contact;
   a first electrode provided on the insulating film and disposed in a region including the region directly above the first semiconductor region, the first electrode including a plurality of first corners that protrude toward the drain contact side in a lower surface of the first electrode; and
   a second electrode provided on the insulating film, disposed at a portion of the region directly above the second semiconductor region, and separated from the first electrode, the second electrode including a plurality of second corners that protrude toward the drain contact side in a lower surface of the second electrode,
   the insulating film including
      a first portion disposed in a region including the region directly above the first semiconductor region,
      a second portion disposed at a portion of the region directly above the second semiconductor region, the second portion being thicker than the first portion,
      a third portion thinner than the second portion and thicker than the first portion, and
      a fourth portion thicker than the third portion, at least a part of the fourth portion being disposed between the second electrode and the drain contact,
   the first portion, the second portion, the third portion, and the fourth portion being arranged in this order along a first direction, the first direction being from the first semiconductor region toward the second semiconductor region,
   the first electrode being disposed in at least a region directly above the first portion and a region directly above the second portion, and
   the second electrode being disposed in at least a region directly above the third portion and a region directly above the fourth portion.

2. The device according to claim 1, wherein the insulating film further includes a fifth portion thinner than the fourth portion and thicker than the first portion.

3. The device according to claim 1, wherein mutually-different potentials can be applied to the first electrode and the second electrode.

4. The device according to claim 1, wherein a lower surface of the first portion is positioned higher than lower surfaces of the second portion, the third portion, and the fourth portion.

5. The device according to claim 1, wherein a distance between the drain contact and the first portion is longer than a distance between the source contact and the first portion.

6. The device according to claim 1, wherein the first electrode and the second electrode are formed of polysilicon.

7. A semiconductor device, comprising:
a semiconductor portion;
a first semiconductor region provided on the semiconductor portion, the first semiconductor region being of a first conductivity type;
a second semiconductor region provided on the semiconductor portion, the second semiconductor region being of a second conductivity type;
a source contact connected to the first semiconductor region;
a drain contact connected to the second semiconductor region;
an insulating film provided from a region directly above the first semiconductor region to a region directly above the second semiconductor region, the insulating film being disposed between the source contact and the drain contact;
a first electrode provided on the insulating film and disposed in a region including the region directly above the first semiconductor region; and
a second electrode provided on the insulating film, disposed at a portion of the region directly above the second semiconductor region, and separated from the first electrode,
the insulating film including
a first portion disposed in a region including the region directly above the first semiconductor region,
a second portion disposed at a portion of the region directly above the second semiconductor region, the second portion being thicker than the first portion,
a third portion thinner than the second portion and thicker than the first portion, and
a fourth portion thicker than the third portion, at least a part of the fourth portion being disposed between the second electrode and the drain contact,
the first portion, the second portion, the third portion, and the fourth portion being arranged in this order along a first direction, the first direction being from the first semiconductor region toward the second semiconductor region,
the first electrode being disposed in at least a region directly above the first portion,
the second electrode being disposed in at least a region directly above the third portion, wherein the second electrode is disposed only in the region directly above the third portion.

8. A semiconductor device, comprising:
a semiconductor portion;
a first semiconductor region provided on the semiconductor portion, the first semiconductor region being of a first conductivity type;
a second semiconductor region provided on the semiconductor portion, the second semiconductor region being of a second conductivity type;
a source contact connected to the first semiconductor region;
a drain contact connected to the second semiconductor region;
an insulating film provided from a region directly above the first semiconductor region to a region directly above the second semiconductor region, the insulating film being disposed between the source contact and the drain contact; and
an electrode provided on the insulating film, the electrode being a gate electrode forming a channel region, the electrode including two or more corners that protrude toward the drain contact side in a lower surface of the electrode,
the insulating film including
a first portion disposed in a region including the region directly above the first semiconductor region,
a second portion disposed at a portion of the region directly above the second semiconductor region, the second portion being thicker than the first portion,
a third portion thinner than the second portion and thicker than the first portion, and
a fourth portion thicker than the third portion, at least a part of the fourth portion being disposed between the electrode and the drain contact,
the first portion, the second portion, the third portion, and the fourth portion being arranged in this order along a first direction, the first direction being from the first semiconductor region toward the second semiconductor region,
the electrode being disposed in regions directly above the first portion, the second portion, the third portion, and the fourth portion.

9. The device according to claim 8, wherein a lower surface of the first portion is positioned higher than lower surfaces of the second portion, the third portion, and the fourth portion.

10. The device according to claim 8, wherein a distance between the drain contact and the first portion is longer than a distance between the source contact and the first portion.

11. The device according to claim 8, wherein the electrode is formed of polysilicon.

* * * * *